(12) United States Patent
Tsuboyama et al.

(10) Patent No.: US 7,361,414 B2
(45) Date of Patent: Apr. 22, 2008

(54) LIGHT EMITTING DEVICE AND DISPLAY APPARATUS USING SAME

(75) Inventors: Akira Tsuboyama, Kanagawa (JP); Shinjiro Okada, Kanagawa (JP); Takao Takiguchi, Tokyo (JP); Kazunori Ueno, Kanagawa (JP); Satoshi Igawa, Kanagawa (JP); Jun Kamatani, Kanagawa (JP); Manabu Furugori, Kanagawa (JP); Hironobu Iwawaki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 513 days.

(21) Appl. No.: 10/507,316

(22) PCT Filed: May 2, 2003

(86) PCT No.: PCT/JP03/05601

§ 371 (c)(1),
(2), (4) Date: Sep. 10, 2004

(87) PCT Pub. No.: WO03/095587

PCT Pub. Date: Nov. 20, 2003

(65) Prior Publication Data

US 2005/0221115 A1   Oct. 6, 2005

(30) Foreign Application Priority Data

May 9, 2002  (JP)  ............................. 2002-134098

(51) Int. Cl.
*H01L 51/54* (2006.01)
*C09K 11/06* (2006.01)

(52) U.S. Cl. ...................... 428/690; 428/917; 313/504; 257/E51.041; 257/E51.044

(58) Field of Classification Search ...................... None
See application file for complete search history.

(56) References Cited

U.S. PATENT DOCUMENTS

| 5,755,999 | A | 5/1998 | Shi et al. ................ 252/301.16 |
| 6,001,284 | A * | 12/1999 | Enokida et al. ............. 252/583 |
| 6,528,187 | B1 | 3/2003 | Okada ......................... 428/690 |
| 2001/0019782 | A1 | 9/2001 | Igarashi et al. ............. 428/690 |
| 2002/0045063 | A1 | 4/2002 | Kim et al. ................... 428/690 |
| 2002/0079830 | A1 * | 6/2002 | Brunner et al. ............. 313/498 |
| 2003/0224208 | A1 | 12/2003 | Kamatani et al. ........... 428/690 |
| 2003/0235712 | A1 | 12/2003 | Takiguchi et al. .......... 428/690 |
| 2004/0013905 | A1 | 1/2004 | Tsuboyama et al. ........ 428/690 |

FOREIGN PATENT DOCUMENTS

| EP | 0 878 529 A2 | 11/1998 |
| JP | 2-8288 | 1/1990 |
| JP | 9-272865 | 10/1997 |
| JP | 10-308277 | 11/1998 |
| JP | 10-330744 | 12/1998 |
| JP | 2000-8033 | 1/2000 |
| JP | 2000-53957 | 2/2000 |
| JP | 2000-144125 | 5/2000 |
| JP | 2000-355687 | 12/2000 |
| JP | 2001-81453 | 3/2001 |
| JP | 2001-247859 | 9/2001 |
| JP | 2002-540572 | 11/2002 |
| WO | WO 00/57676 A1 | 9/2000 |

OTHER PUBLICATIONS

C. H. Chen et al., "Recent Developments in Molecular Organic Electroluminescent Materials", *Macromol. Symp. 125*, 1997, pp. 1-48.
Y. Ma et al., "High Luminescence Gold(I) and Copper(I) Complexes with a Triplet Excited State for Use in Light-Emitting Diodes", *Advanced Materials.*, vol. 11, No. 10, 1999, pp. 852-857.
Delphine Felder et al., "Highly Luminescent Cu(I)-Phenanthroline Complexes in Rigid Matrix and Temperature Dependence of the Photophysical Properties", *J. Am. Chem. Soc.*, 2001, 123. pp. 6291-6299.
Rosemary A. Rader et al., "Photostudies of $[Cu(bpy)(PPh_3)_2]^+$, $[Cu(phen)(PPh_3)_2]^+$, and $[Cu(dmp)(PPh_3)_2]^+$ in Solution and in Rigid, Low-Temperature Glasses. Simultaneous Multiple Emissions from Intraligand and Charge-Transfer States", *J. Am. Chem. Soc.*, 1981, 103, pp. 5906-5912.
Mark T. Miller et al., "Effects of Sterics and Electronic Delocalization on the Photophysical, Structural, and Electrochemical Properties of 2,9-Disubstituted 1,10-Phenanthroline Copper(I) Complexes", *Inorg. Chem.*, 1999, 38, pp. 3414-3422.
Toshiyuki Shono et al., "Syntheses of Copper (I) Triphenylphosphine Complexes", *Chemistry Letters*, 1972, pp. 163-164.
Whei-Lu Kwik et al., "Ternary Complexes of Copper (I) with 2,9-Dimethyl-1,10-phenanthroline and Some Oxygen-donor Ligands", *J.C.S. Dalton*, 1981, pp. 452-455.
Mark T. Miller et al., A Highly Emissive Heteroleptic Copper (I) Bis(phenanthroline) Complex: $[Cu(dbp)(dmp)]^+$ (dbp=2,9-Di-*tert*-butyl-1,10-phenanthroline; dmp=2,9-Dimethyl-1,10-phenanthroline), *J. Am. Chem. Soc.*, 1999, 121, pp. 4292-4293.
Michèle K. Eggleston et al., "Steric Effects in the Ground and Excited States of $Cu(NN)_2^+$ Systems", *Inorg. Chem.*, 1997, 36, pp. 172-176.
R. Michael Everly et al., "Reinvestigation of the Absorbing and Emitting Charge-Transfer Excited States of $[Cu(NN)_2]^+$ Systems", *J. Phys. Chem.*, 1991, 95, pp. 9071-9075.
Arai et al., "Photocharacteristics of Copper Complex Containing Diphosphine and Diimine", Ext. Abstracts (51st Complex Chemistry Forum), p. 578, 2P-F13 (2001).
Kinoshita et al., "Development of Sulfur-Crosslinked Large Rix Calix [4]pyridine and Novel Complex Group", Ext. Abstracts (51st Complex Chemistry Forum), p. 425, 253-06 (2001).

* cited by examiner

*Primary Examiner*—Marie Yamnitzky
(74) *Attorney, Agent, or Firm*—Fitzpatrick, Cella, Harper & Scinto (57) ABSTRACT

There is provided a high light-emission-efficiency, highly stable, low-cost light emitting device that utilizes a copper complex as a light emitting material and comprises a pair of electrodes provided on a substrate, and an organic substance layer provided between the electrode and comprising a metal coordination compound having a partial structure represented by the general formula (1):

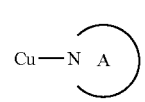

(1)

wherein Cu represents a copper ion.

4 Claims, 10 Drawing Sheets

1001 PPh3
1002 dm-diktn
1003 6Fdm-diktn
1004 bph-diktn

1005 dtb-diktn
1006 qnl
1007 dPPh2
1008 PIC

LIGHT EMITTING DEVICE AND DISPLAY APPARATUS USING SAME

TECHNICAL FIELD

The present invention relates to a light emitting device using an organic compound and more particularly, relates to a light emitting device improved in stability and light emission efficiency by employing a metal coordination compound as a light emitting material.

BACKGROUND ART

Figure 1A:
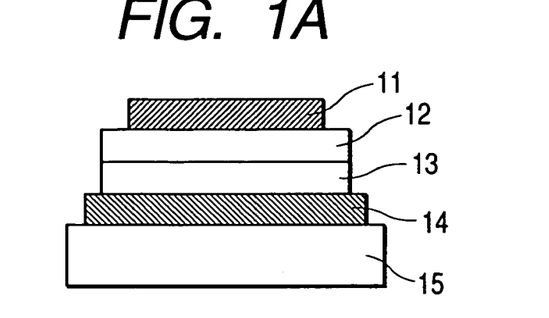
FIGS. 1A, 1B and 1C are views each illustrating a constitution of an ordinary light emitting device.
Figure 1B:
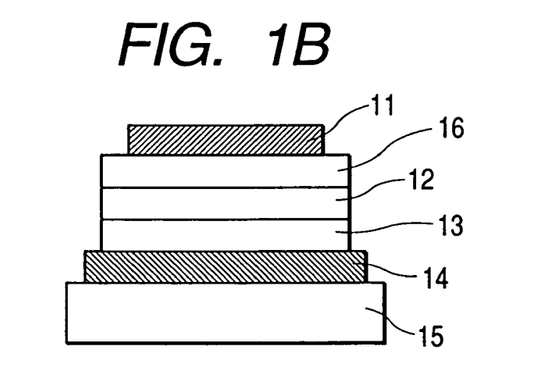
Figure 1C:
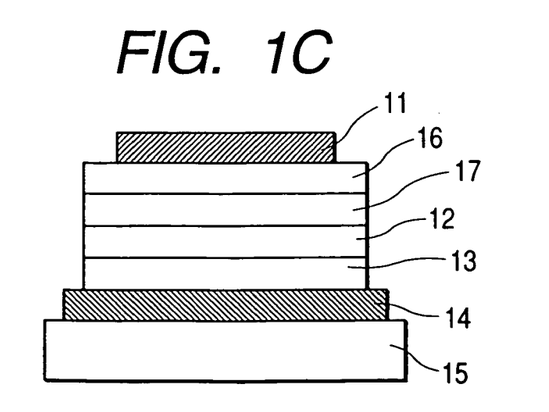

The organic EL (electroluminescent) device is being actively subjected to application study as a light emitting device of a high-speed response and a high light emission efficiency. The basic constitution thereof is shown in FIGS. 1A to 1C (see, for example, Macromol. Symp. 125, 1-48 (1997)).

As shown in FIGS. 1A to 1C, an organic EL device is generally composed of a transparent electrode 14 and a metal electrode 11 on a transparent substrate 15, and a plurality of organic film layers disposed between the electrodes.

In FIG. 1A, an organic layer consists of a light emitting layer 12 and a hole transport layer 13. As the material for the transparent electrode 14, a material with a large work function, such as ITO, is used to achieve good hole-injecting characteristics from the transparent electrode 14 to the hole transport layer 13. As the material for the metal electrode 11, a material with a small work function, such as aluminum, magnesium and alloys thereof, is used to achieve good electron-injecting characteristics to the organic layer. These electrodes generally have a thickness of 50-200 nm.

Figure 2:
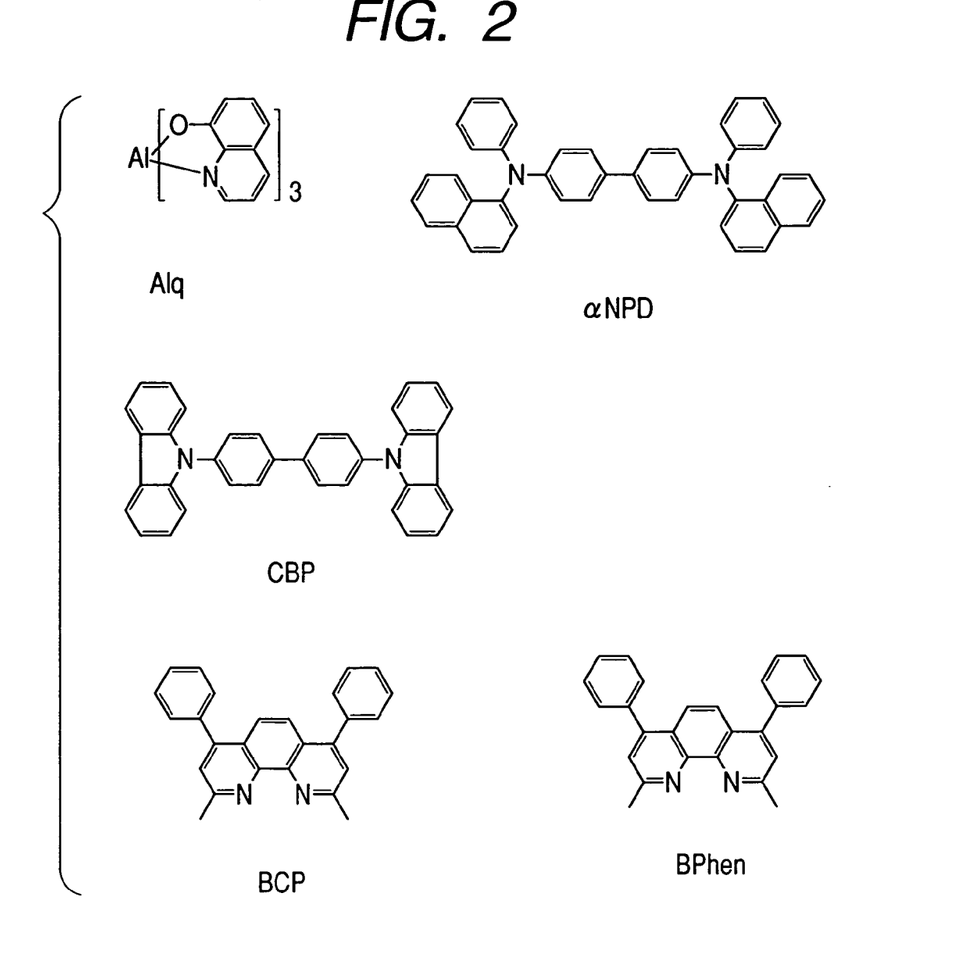
FIG. 2 is a view illustrating chemical structures of ordinary electron transport materials and hole transport materials.
Figure 3:
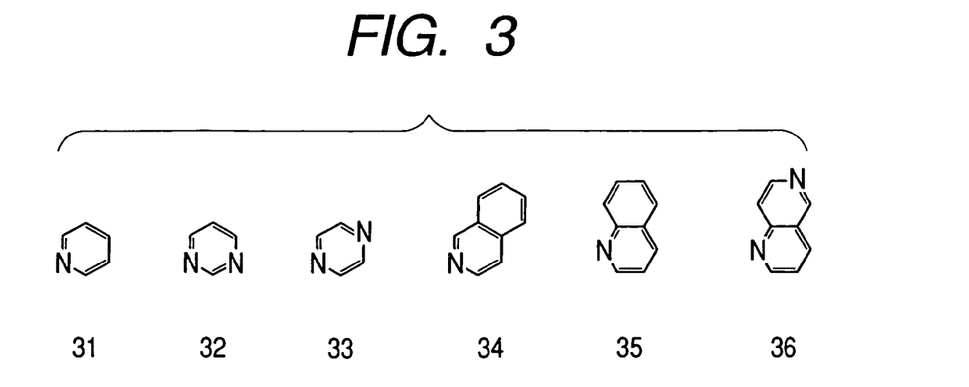
FIG. 3 is a view illustrating monodentate ligands having an aromatic ring imine structure that can be utilized for copper complexes of the present invention, the nitrogen atom of which coordinates with copper (Cu)
Figure 4:
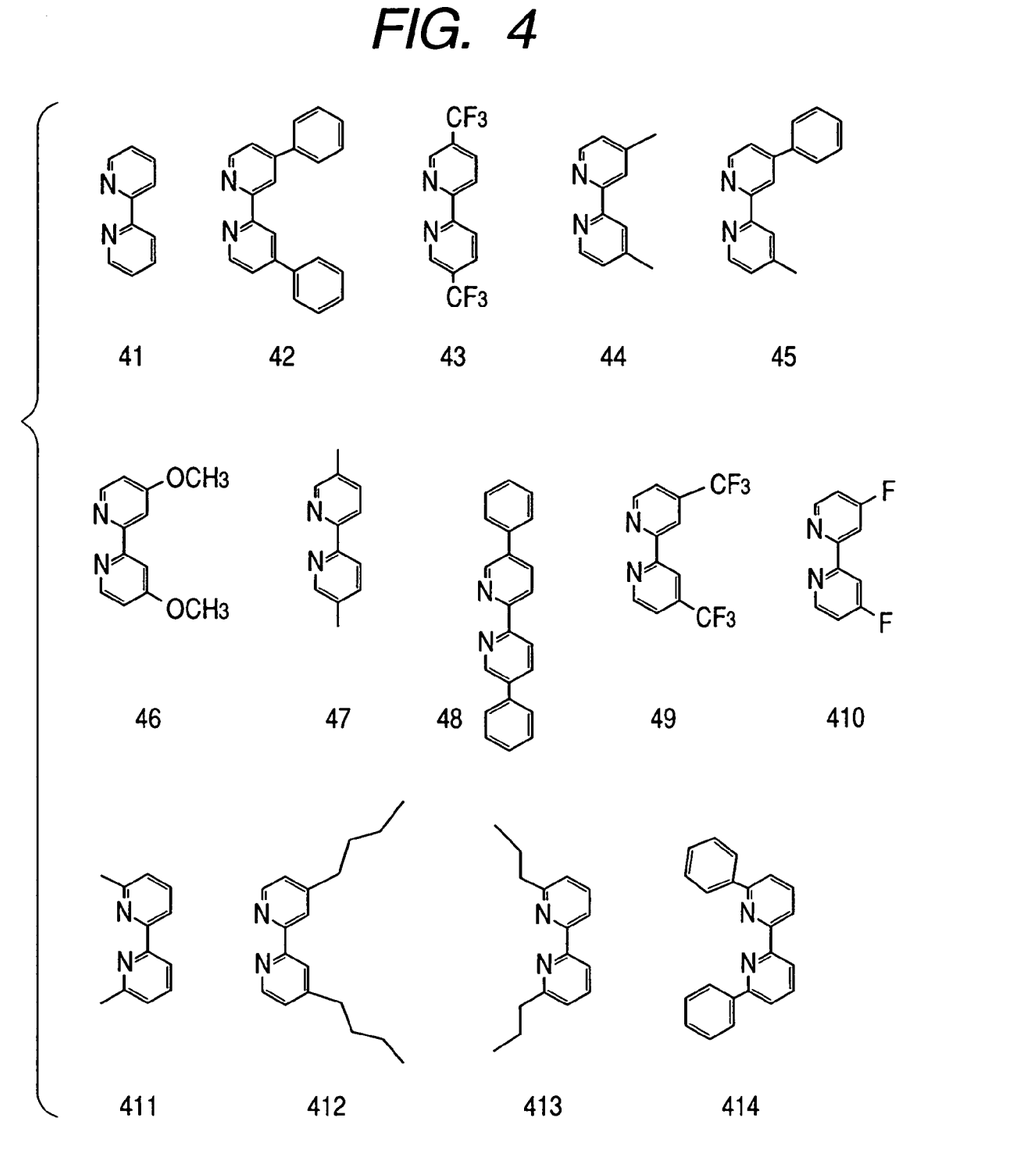
FIG. 4 is a view illustrating bidentate ligands having a bipyridine structure that can be utilized for copper complexes of the present invention, the two nitrogen atoms of the bipyridine of which coordinates with copper (Cu)
Figure 5:
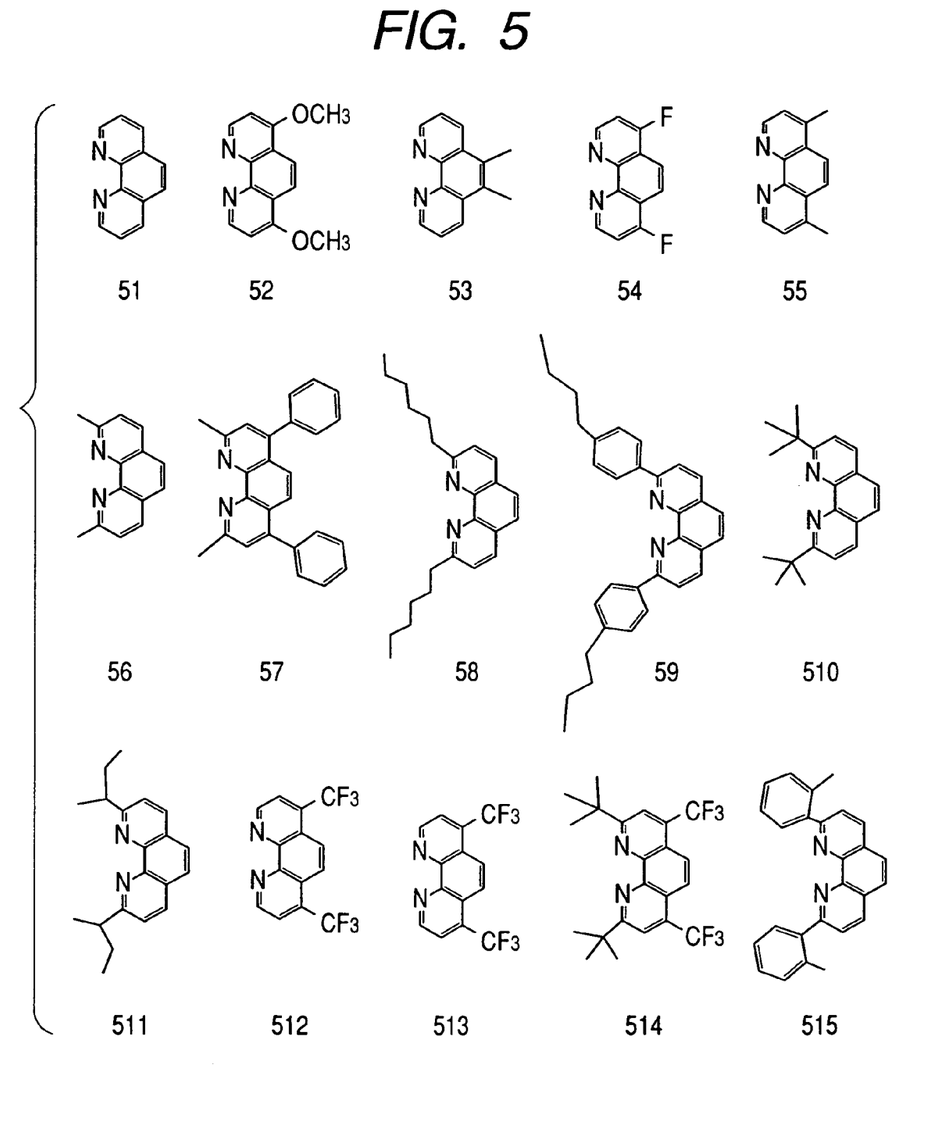
FIG. 5 is a view illustrating bidentate ligands having a phenanthroline structure that can be utilized for copper complexes of the present invention, the two nitrogen atoms of which coordinates with copper (Cu)
Figure 6:
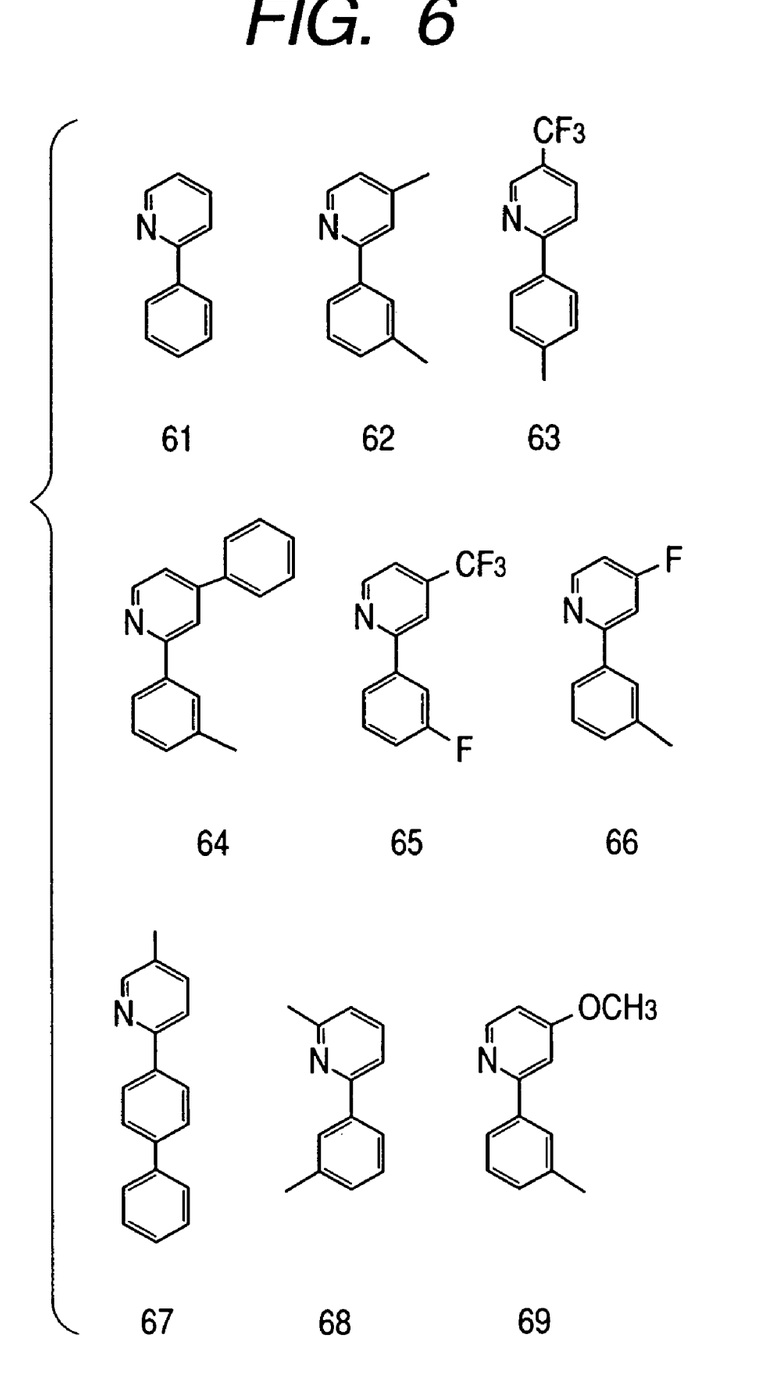
FIG. 6 is a view illustrating bidentate ligands having a 2-phenylpyridine structure that can be utilized for copper complexes of the present invention, which coordinates with copper (Cu) at position 2 of each of the pyridine and phenyl.
Figure 7:
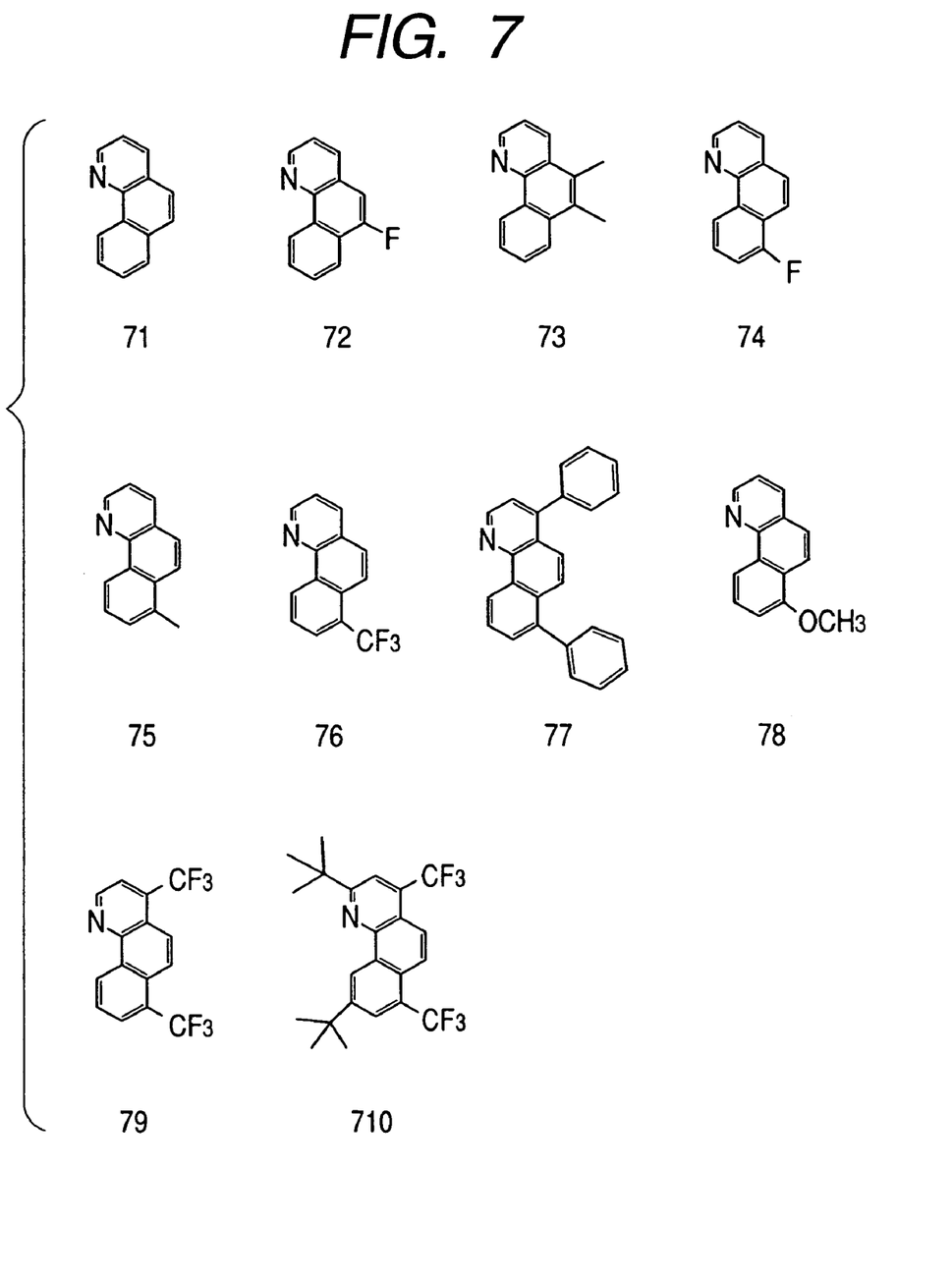
FIG. 7 is a view illustrating bidentate ligands having a benzoquinoline structure that can be utilized for copper complexes of the present invention, the nitrogen and carbon of the rings of which coordinates with copper (Cu)

For the light emitting layer 12, an aluminoquinolinol complex (a representative example is Alq shown in FIG. 2) or the like is used. As the hole transport layer 13, for example, an electron-donating material such as a triphenylamine derivative (a representative example is α-NPD shown in FIG. 2) is used.

The organic EL device constructed as described above has a rectifying property, and when an electric field is applied so as to make the metal electrode 11 act as a cathode and the transparent electrode 14 act as an anode, electrons are injected from the metal electrode 11 into the light emitting layer 12, and holes are injected from the transparent electrode 14 into the light emitting layer 12.

When the injected holes and electrons recombine in the light emitting layer 12, excitons are formed to emit light. At this time, the hole transport layer 13 plays the role of an electron blocking layer to raise the recombination efficiency at the light emitting layer 12/hole transport layer 13 interface, and to enhance the light emission efficiency.

Furthermore, in FIG. 1B, an electron transport layer 16 is formed between the metal layer 11 and the light emitting layer 12 of FIG. 1A. Thus, the light emitting function can be isolated from the electron/hole transport function to make the carrier blocking action more effective, thereby improving the light emission efficiency. As the material for the electron transport layer 16, for example, an oxadiazole derivative or the like can be used.

Furthermore, as shown in FIG. 1C, an exciton-diffusion preventing layer 17 is additionally provided in order to confine excitons generated in the light emitting layer 12 within the light emitting layer 12 to effect efficient light emission.

Moreover, it is also possible to constitute an organic EL device with a single layer structure of an organic substance layer. Such a device is generally produced by forming a first electrode on a substrate, then forming a polymer film thereon by a coating method or the like, and forming a second electrode on the top thereof, but can also be produced by vacuum vapor deposition of low-molecular weight compounds.

Further, there are generally used two types of the light emitting layer, that is, a guest-host type wherein a light emitting material is dispersed in a carrier transport material, and another type wherein only a light emitting material is used in 100%. Most light emitting materials, when used in a high concentration in a light emitting layer, are liable to show a decreased light emission efficiency, and in such a case, it is preferable to select a suitable host material to adopt a guest-host type light emitting layer.

In the present invention, copper complex compounds of specific structures are employed as a light emitting material of an organic EL device.

As for the prior art concerning copper complexes, there are techniques using copper complex compounds different from the copper complex compounds employed in the present invention, but there are no disclosure of those copper complex compounds having sufficient performance to be used for display, illumination, or the like.

Examples of the prior art are identified as follows.

Document 1: Y. Ma et al., Advanced Materials, 1999, 11, No. 10, p85, High Luminescence Gold (1) and Copper (1) Complexes with Triplet Excited State for Use in Light-Emitting diodes Document 2: Japanese Patent Application Laid-Open No. 10-308277 (Japanese Patent No. 2940514) to T. Azumaguchi et al.

There is a description therein that copper complexes can be produced at a relatively low cost and sufficiently drawing the performance of copper complexes makes it possible to provide low-cost, high-performance organic EL devices.

However, because EL devices obtained in the above documents have extremely low light emission efficiencies, and because there is no sufficient description in the above documents of the efficiencies of the devices, it is not believed that the characteristics of copper complexes were sufficiently drawn.

DISCLOSURE OF THE INVENTION

It is, therefore, an object of the present invention to provide a high light-emission-efficiency, highly stable, low-cost light emitting device.

In the light emitting device in accordance with the present invention, there are employed as a light emitting material copper complex compounds, which include not only known compounds but also novel compounds.

According to the present invention, there is provided a light emitting device comprising a pair of electrodes provided on a substrate, and an organic substance layer provided between the electrode and comprising a metal coordination compound having a partial structure represented by the general formula (1):

(1)

wherein Cu represents a copper ion, and heterocyclic ring A including nitrogen atom N represents a pyridine or quinoline ring, or a heterocyclic ring having one or more C—H of a pyridine or quinoline ring replaced with nitrogen atom(s), and the heterocyclic rings may have a substituent selected from the group consisting of an aromatic ring group that may have a substituent, a halogen atom, or a linear or branched alkyl group having 1 to 10 carbon atoms in which only a single methylene group or two or more non-adjacent methylene groups of the alkyl group may be substituted with —O—, —S—, —CO—, —CO—O—, —O—CO—, —CH=CH—, or —C≡C—, and a hydrogen atom of the alkyl group may be substituted with a fluorine atom or an aromatic ring group.

BEST MODE FOR CARRYING OUT THE INVENTION

The copper complexes employed in the present invention is mainly characterized in that the copper ion as a metal center is in +1 charge state. For the electron configuration of a copper atom, a copper ion of +1 charge has 10 d-electrons. The present inventors' experience shows that most transition metals having an even number of d-metals exhibit good light emission characteristics. As copper ions, there are known ions of +1 charge and +2 charge. In the present invention, +1 charge copper ion compounds are mainly used, but it should be noted that use of +2 charge copper ion compounds is not excluded.

Further, FIGS. 3 to 11 show monodentate, bidentate or tridentate ligands as the constituents of the compounds used for the copper complexes of the present invention.

In the present invention, those metal coordination compounds are used which have the above monodentate, bidentate or tridentate ligands coordinated with copper. The above mentioned ligands include those of 0 charge and −1 charge, which are combined with copper of the +1 charge to give metal coordination compounds with an overall charge of 0 or +1. The +1 charge metal coordination compounds will have a counter anion, which is, however, not particularly limited as long as it is an ion of −1 charge such as $ClO_4^-$, $PF_6^-$, $BF_4^-$, $BPh_4^-$-(tetra-phenylborate anion), or the like.

The synthesis of the above mentioned copper coordination compounds is described in the following documents. By following the synthesis examples shown therein, the copper coordination compounds of the present invention can easily be synthesized. For example, the compound examples shown in FIG. 12 can be synthesized by referring to the following papers.

Figure 12:
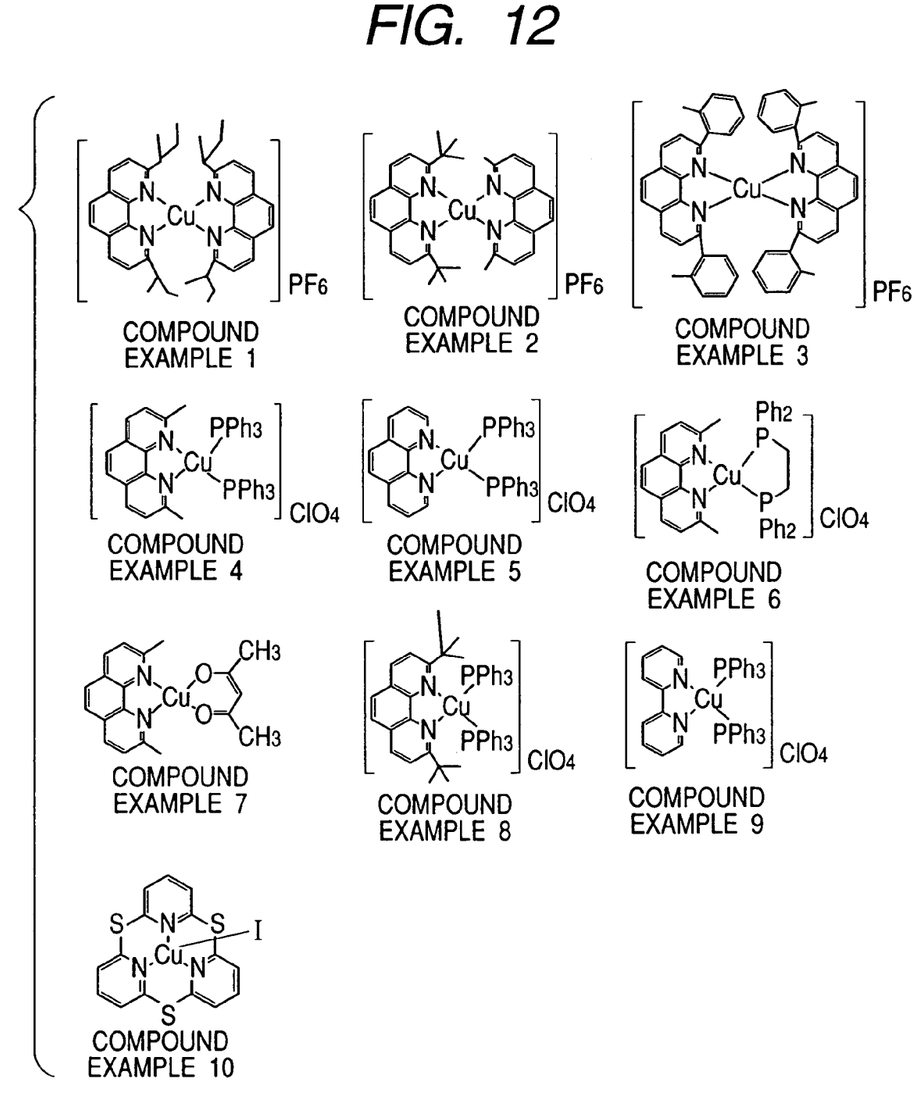
FIG. 12 is a view showing examples of copper complex compounds employed in the present invention.

Compound Example 1: Document 8
Compound Example 2: Document 7
Compound Example 3: Document 3
Compound Example 4: Document 4
Compound Example 5: Document 4
Compound Example 6: Document 9
Compound Example 7: Document 6
Compound Example 8: Document 4
Compound Example 9: Document 4
Compound Example 10: Document 10

[Synthesis Document]

Document 1: D. Felder, et al., "Highly Luminescent Cu(1)-Phenanthroline Complex in Rigid Matrix and Temperature Dependence of the Photophysical Properties", Journal of American Chemical Society, 2001, 123, p 6299;

Document 2: T. Shono, et al., "Syntheses of Copper(1) Triphenylphosphine Complex", Chemistry Letters, 1972, p 163;

Document 3: M. T. Miller, et al., "Effects of Steric and Electronic Delocalization on the Photophysical, Structural and Electrochemical Properties of 2,9-Disubstituted 1,10-Phenanthroline Copper(1) Complex", Inorganic Chemistry, 1999, 38, p 3414;

Document 4: R. A. Rader, et al., "Photostudies of [Cu(bpy)(PPh3)2]+, [Cu(phen)(PPh3)2]+, and [Cu(dmp)(PPh3)2]+ in Solution and in Rigid, Low Temperature Glasses, Simultaneous Multiple Emissions from Intraligand and Charge Transfer States", Journal of the American Chemical Society, 1981, 103, p 5906;

Document 5: R. M. Everly et al., "Reinvestigation of the Absorbing and Emitting Charge-Transfer Excited States of [Cu(NN)2]+ Systems, Journal of Physical Chemistry, 1991, 95, p 9071;

Document 6: Whei-Lu Kwik et al., "Ternary Complexes of Copper (1) with 2,9-Dimethyl-1,10-Phenanthroline and some Oxygen-doner Ligands", Journal of Chemical Society of Dalton;

Document 7: M. T. Miller et al., "A Highly Emissive Heteroleptic Copper(1) Bis(phenanthroline) Complex: [Cu(dbp)(dmp)]+", Journal of American Chemical Society, 1999, 121, p 4292;

Document 8: M. K. Eggleston et al., "Steric Effects in Ground and Excites States of Cu(NN)2+System", Inorganic Chemistry, 1997, 36, p172;

Document 9: Arai et al., "Photocharacteristics of Copper (1) Complex Containing Diphosphine and Diimine", Extended Abstracts (51th Complex Chemistry Forum), p 578, 2P-F13; and Document 10: Kinoshita et al., "Development of Sulfur-Crosslinked Large Ring Calix[4]pyridine and Novel Complex Group", Extended Abstracts (51th Complex Chemistry Forum), p 425, 2S3-06.

Figure 13:
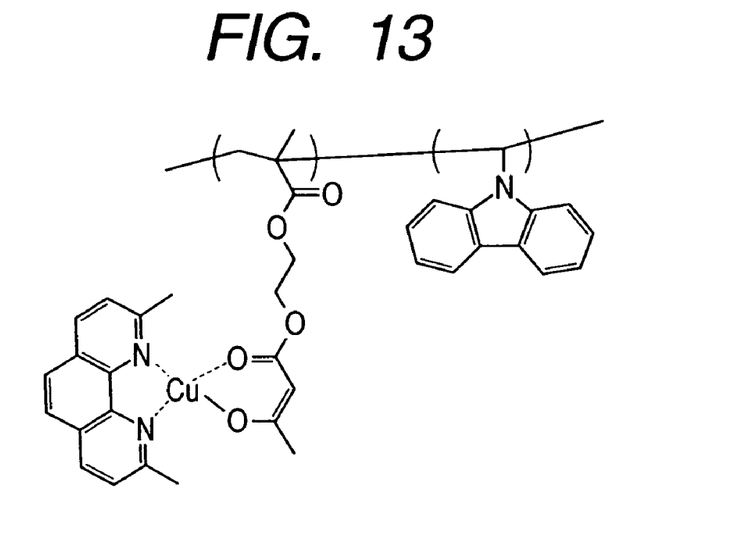
FIG. 13 is a view showing the structure of a polymer copper complex employed in the present invention.

The present invention includes not only the ordinary organic copper complex compounds exemplified in FIG. 12 but also polymer compounds having a copper coordination moiety incorporated into the chain thereof such as shown in FIG. 13.

Tables 1 to 5 show compound examples of the metal complexes that can be used for the present invention. In the tables, the number in each of the columns of "Ligand 1" and "Ligand 2" means the number assigned for the ligands in FIGS. 3 to 11, and the blank in each of the columns of "Number of Ligand 1" and "Number of Ligand 2" means that the number is 1 (i.e., no indication of the number means 1).

TABLE 1

| Compound No. | Ligand 1 | Number of Ligand 1 | Ligand 2 | Number of Ligand 2 |
|---|---|---|---|---|
| 1 | 511 |  | 511 |  |
| 2 | 510 |  | 55 |  |
| 3 | 515 |  | 515 |  |
| 4 | 55 |  | 1002 |  |
| 5 | 51 |  | 1001 | 2 |
| 6 | 55 |  | 1007 |  |
| 7 | 55 |  | 1002 |  |
| 8 | 510 |  | 1001 | 2 |
| 9 | 41 |  | 1001 | 2 |
| 10 | 1101 |  | Iodine Ion |  |
| 11 | 42 |  | 1001 | 2 |
| 12 | 43 |  | 1001 | 2 |
| 13 | 44 |  | 1001 | 2 |
| 14 | 45 |  | 1001 | 2 |
| 15 | 46 |  | 1001 | 2 |
| 16 | 47 |  | 1001 | 2 |
| 17 | 48 |  | 1001 | 2 |
| 18 | 49 |  | 1001 | 2 |
| 19 | 410 |  | 1001 | 2 |
| 20 | 411 |  | 1001 | 2 |
| 21 | 412 |  | 1001 | 2 |
| 22 | 413 |  | 1001 | 2 |
| 23 | 414 |  | 1001 | 2 |
| 24 | 41 |  | 1002 |  |
| 25 | 42 |  | 1002 |  |
| 26 | 43 |  | 1002 |  |
| 27 | 44 |  | 1002 |  |
| 28 | 45 |  | 1002 |  |
| 29 | 46 |  | 1002 |  |
| 30 | 47 |  | 1002 |  |
| 31 | 48 |  | 1002 |  |
| 32 | 49 |  | 1002 |  |
| 33 | 410 |  | 1002 |  |
| 34 | 411 |  | 1002 |  |
| 35 | 412 |  | 1002 |  |
| 36 | 413 |  | 1002 |  |
| 37 | 414 |  | 1002 |  |
| 38 | 41 |  | 1005 |  |
| 39 | 42 |  | 1005 |  |
| 40 | 43 |  | 1005 |  |
| 41 | 44 |  | 1005 |  |
| 42 | 45 |  | 1005 |  |
| 43 | 46 |  | 1005 |  |
| 44 | 47 |  | 1005 |  |
| 45 | 48 |  | 1005 |  |
| 46 | 49 |  | 1005 |  |
| 47 | 410 |  | 1005 |  |
| 48 | 411 |  | 1005 |  |
| 49 | 412 |  | 1005 |  |
| 50 | 413 |  | 1005 |  |
| 51 | 414 |  | 1005 |  |
| 52 | 51 |  | 56 |  |
| 53 | 52 |  | 56 |  |
| 54 | 53 |  | 56 |  |
| 55 | 54 |  | 56 |  |
| 56 | 55 |  | 56 |  |
| 57 | 56 |  | 56 |  |
| 58 | 57 |  | 56 |  |
| 59 | 58 |  | 56 |  |
| 60 | 59 |  | 56 |  |

TABLE 2

| Compound No. | Ligand 1 | Number of Ligand 1 | Ligand 2 | Number of Ligand 2 |
|---|---|---|---|---|
| 61 | 510 |  | 56 |  |
| 62 | 511 |  | 56 |  |
| 63 | 512 |  | 56 |  |
| 64 | 513 |  | 56 |  |
| 65 | 514 |  | 56 |  |
| 66 | 51 |  | 510 |  |
| 67 | 52 |  | 510 |  |
| 68 | 53 |  | 510 |  |
| 69 | 54 |  | 510 |  |
| 70 | 55 |  | 510 |  |
| 71 | 57 |  | 510 |  |
| 72 | 58 |  | 510 |  |
| 73 | 59 |  | 510 |  |
| 74 | 510 |  | 510 |  |
| 75 | 511 |  | 510 |  |
| 76 | 512 |  | 510 |  |
| 77 | 513 |  | 510 |  |
| 78 | 514 |  | 510 |  |
| 79 | 51 |  | 58 |  |
| 80 | 52 |  | 58 |  |
| 81 | 53 |  | 58 |  |
| 82 | 54 |  | 58 |  |
| 83 | 55 |  | 58 |  |
| 84 | 57 |  | 58 |  |
| 85 | 58 |  | 58 |  |
| 86 | 59 |  | 58 |  |
| 87 | 510 |  | 58 |  |
| 88 | 511 |  | 58 |  |
| 89 | 512 |  | 58 |  |
| 90 | 513 |  | 58 |  |
| 91 | 514 |  | 58 |  |
| 92 | 51 |  | 514 |  |
| 93 | 52 |  | 514 |  |
| 94 | 53 |  | 514 |  |
| 95 | 54 |  | 514 |  |
| 96 | 55 |  | 514 |  |
| 97 | 56 |  | 514 |  |
| 98 | 57 |  | 514 |  |
| 99 | 59 |  | 514 |  |
| 100 | 511 |  | 514 |  |
| 101 | 512 |  | 514 |  |
| 102 | 513 |  | 514 |  |
| 103 | 514 |  | 514 |  |
| 104 | 51 |  | 1002 |  |
| 105 | 52 |  | 1002 |  |
| 106 | 53 |  | 1002 |  |
| 107 | 54 |  | 1002 |  |

TABLE 2-continued

| Compound No. | Ligand 1 | Number of Ligand 1 | Ligand 2 | Number of Ligand 2 |
|---|---|---|---|---|
| 108 | 55 |  | 1002 |  |
| 109 | 56 |  | 1002 |  |
| 110 | 57 |  | 1002 |  |
| 111 | 58 |  | 1002 |  |
| 112 | 59 |  | 1002 |  |
| 113 | 511 |  | 1002 |  |
| 114 | 512 |  | 1002 |  |
| 115 | 513 |  | 1002 |  |
| 116 | 514 |  | 1002 |  |
| 117 | 51 |  | 1005 |  |
| 118 | 52 |  | 1005 |  |
| 119 | 53 |  | 1005 |  |
| 120 | 54 |  | 1005 |  |

TABLE 3

| Compound No. | Ligand 1 | Number of Ligand 1 | Ligand 2 | Number of Ligand 2 |
|---|---|---|---|---|
| 121 | 55 |  | 1005 |  |
| 122 | 56 |  | 1005 |  |
| 123 | 57 |  | 1005 |  |
| 124 | 58 |  | 1005 |  |
| 125 | 59 |  | 1005 |  |
| 126 | 511 |  | 1005 |  |
| 127 | 512 |  | 1005 |  |
| 128 | 513 |  | 1005 |  |
| 129 | 514 |  | 1005 |  |
| 130 | 51 |  | 1007 |  |
| 131 | 52 |  | 1007 |  |
| 132 | 53 |  | 1007 |  |
| 133 | 54 |  | 1007 |  |
| 134 | 55 |  | 1007 |  |
| 135 | 56 |  | 1007 |  |
| 136 | 57 |  | 1007 |  |
| 137 | 58 |  | 1007 |  |
| 138 | 59 |  | 1007 |  |
| 139 | 510 |  | 1007 |  |
| 140 | 511 |  | 1007 |  |
| 141 | 512 |  | 1007 |  |
| 142 | 513 |  | 1007 |  |
| 143 | 514 |  | 1007 |  |
| 144 | 51 |  | 1001 | 2 |
| 145 | 52 |  | 1001 | 2 |
| 146 | 53 |  | 1001 | 2 |
| 147 | 54 |  | 1001 | 2 |
| 148 | 55 |  | 1001 | 2 |
| 149 | 56 |  | 1001 | 2 |
| 150 | 57 |  | 1001 | 2 |
| 151 | 58 |  | 1001 | 2 |
| 152 | 59 |  | 1001 | 2 |
| 153 | 510 |  | 1001 | 2 |
| 154 | 511 |  | 1001 | 2 |
| 155 | 512 |  | 1001 | 2 |
| 156 | 513 |  | 1001 | 2 |
| 157 | 514 |  | 1001 | 2 |
| 158 | 61 |  | 1007 |  |
| 159 | 62 |  | 1007 |  |
| 160 | 63 |  | 1007 |  |
| 161 | 64 |  | 1007 |  |
| 162 | 65 |  | 1007 |  |
| 163 | 66 |  | 1007 |  |
| 164 | 67 |  | 1007 |  |
| 165 | 68 |  | 1007 |  |
| 166 | 69 |  | 1007 |  |
| 167 | 61 |  | 1001 | 2 |
| 168 | 62 |  | 1001 | 2 |
| 169 | 63 |  | 1001 | 2 |
| 170 | 64 |  | 1001 | 2 |
| 171 | 65 |  | 1001 | 2 |
| 172 | 66 |  | 1001 | 2 |
| 173 | 67 |  | 1001 | 2 |
| 174 | 68 |  | 1001 | 2 |
| 175 | 69 |  | 1001 | 2 |
| 176 | 71 |  | 1001 | 2 |
| 177 | 72 |  | 1001 | 2 |
| 178 | 73 |  | 1001 | 2 |
| 179 | 74 |  | 1001 | 2 |
| 180 | 75 |  | 1001 | 2 |

TABLE 4

| Compound No. | Ligand 1 | Number of Ligand 1 | Ligand 2 | Number of Ligand 2 |
|---|---|---|---|---|
| 181 | 76 |  | 1001 | 2 |
| 182 | 77 |  | 1001 | 2 |
| 183 | 78 |  | 1001 | 2 |
| 184 | 79 |  | 1001 | 2 |
| 185 | 710 |  | 1001 | 2 |
| 186 | 71 |  | 1002 |  |
| 187 | 72 |  | 1002 |  |
| 188 | 73 |  | 1002 |  |
| 189 | 74 |  | 1002 |  |
| 190 | 75 |  | 1002 |  |
| 191 | 76 |  | 1002 |  |
| 192 | 77 |  | 1002 |  |
| 193 | 78 |  | 1002 |  |
| 194 | 79 |  | 1002 |  |
| 195 | 710 |  | 1002 |  |
| 196 | 81 |  | 1002 |  |
| 197 | 82 |  | 1002 |  |
| 198 | 83 |  | 1002 |  |
| 199 | 84 |  | 1002 |  |
| 200 | 85 |  | 1002 |  |
| 201 | 86 |  | 1002 |  |
| 202 | 87 |  | 1002 |  |
| 203 | 88 |  | 1002 |  |
| 204 | 89 |  | 1002 |  |
| 205 | 81 |  | 1005 |  |
| 206 | 82 |  | 1005 |  |
| 207 | 83 |  | 1005 |  |
| 208 | 84 |  | 1005 |  |
| 209 | 85 |  | 1005 |  |
| 210 | 86 |  | 1005 |  |
| 211 | 87 |  | 1005 |  |
| 212 | 88 |  | 1005 |  |
| 213 | 89 |  | 1005 |  |
| 214 | 91 |  | 1007 |  |
| 215 | 92 |  | 1007 |  |
| 216 | 93 |  | 1007 |  |
| 217 | 94 |  | 1007 |  |
| 218 | 95 |  | 1007 |  |
| 219 | 96 |  | 1007 |  |
| 220 | 97 |  | 1007 |  |
| 221 | 91 |  | 1001 | 2 |
| 222 | 92 |  | 1001 | 2 |
| 223 | 93 |  | 1001 | 2 |
| 224 | 94 |  | 1001 | 2 |
| 225 | 95 |  | 1001 | 2 |
| 226 | 96 |  | 1001 | 2 |
| 227 | 97 |  | 1001 | 2 |
| 228 | 91 |  | 57 |  |
| 229 | 92 |  | 57 |  |
| 230 | 93 |  | 57 |  |
| 231 | 94 |  | 57 |  |
| 232 | 95 |  | 57 |  |
| 233 | 96 |  | 57 |  |
| 234 | 97 |  | 57 |  |
| 235 | 111 | 2 | 1002 |  |
| 236 | 112 | 2 | 1002 |  |
| 237 | 113 | 2 | 1002 |  |
| 238 | 114 | 2 | 1002 |  |
| 239 | 115 | 2 | 1002 |  |
| 240 | 116 | 2 | 1002 |  |

TABLE 5

| Compound No. | Ligand 1 | Number of Ligand 1 | Ligand 2 | Number of Ligand 2 |
|---|---|---|---|---|
| 241 | 111 | 2 | 1005 | |
| 242 | 112 | 2 | 1005 | |
| 243 | 113 | 2 | 1005 | |
| 244 | 114 | 2 | 1005 | |
| 245 | 115 | 2 | 1005 | |
| 246 | 116 | 2 | 1005 | |
| 247 | 111 | 2 | 1001 | 2 |
| 248 | 112 | 2 | 1001 | 2 |
| 249 | 113 | 2 | 1001 | 2 |
| 250 | 114 | 2 | 1001 | 2 |
| 251 | 115 | 2 | 1001 | 2 |
| 252 | 116 | 2 | 1001 | 2 |
| 253 | 31 | 2 | 1002 | |
| 254 | 32 | 2 | 1002 | |
| 255 | 33 | 2 | 1002 | |
| 256 | 34 | 2 | 1002 | |
| 257 | 35 | 2 | 1002 | |
| 258 | 36 | 2 | 1002 | |
| 259 | 37 | 2 | 1002 | |
| 260 | 31 | 2 | 1007 | |
| 261 | 32 | 2 | 1007 | |
| 262 | 33 | 2 | 1007 | |
| 263 | 34 | 2 | 1007 | |
| 264 | 35 | 2 | 1007 | |
| 265 | 36 | 2 | 1007 | |
| 266 | 37 | 2 | 1007 | |
| 267 | 31 | 2 | 1005 | |
| 268 | 32 | 2 | 1005 | |
| 269 | 33 | 2 | 1005 | |
| 270 | 34 | 2 | 1005 | |
| 271 | 35 | 2 | 1005 | |
| 272 | 36 | 2 | 1005 | |
| 273 | 37 | 2 | 1005 | |
| 274 | 56 | | 1008 | |
| 275 | 510 | | 1008 | |
| 276 | 411 | | 1008 | |

Figure 8:
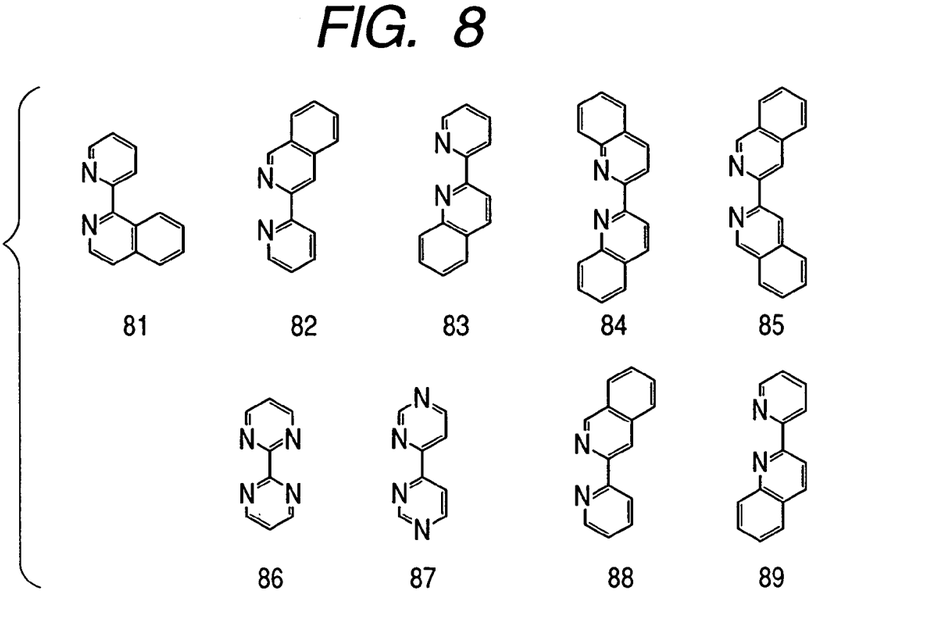
FIG. 8 is a view illustrating bidentate ligands having a bipyridine derivative structure that can be utilized for copper complexes of the present invention.
Figure 9:
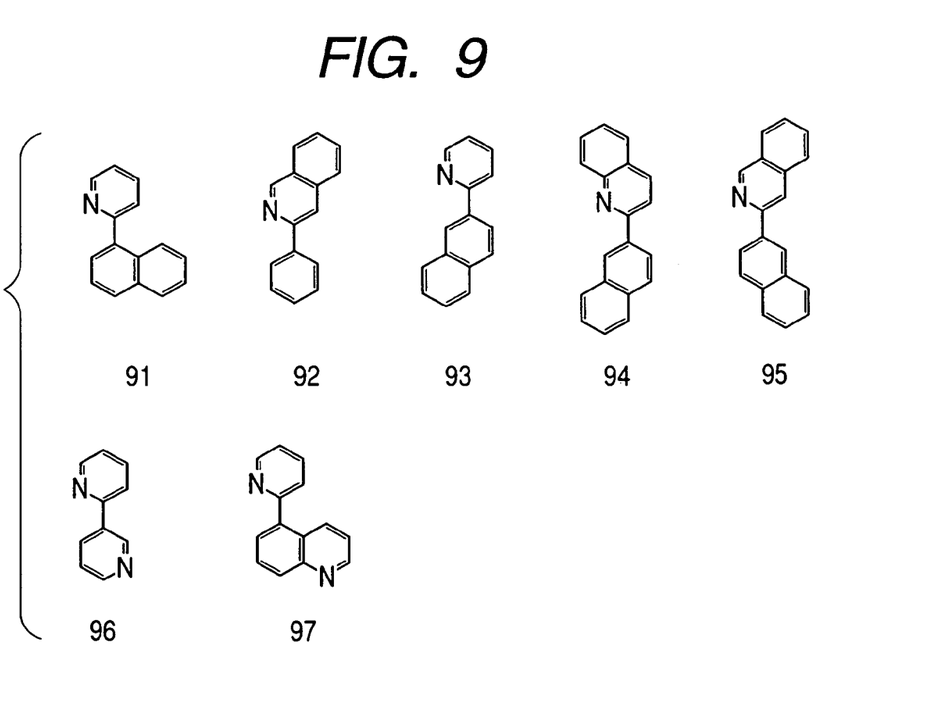
FIG. 9 is a view illustrating bidentate ligands having a 2-phenylpyridine derivative structure that can be utilized for copper complexes of the present invention.
Figure 10:
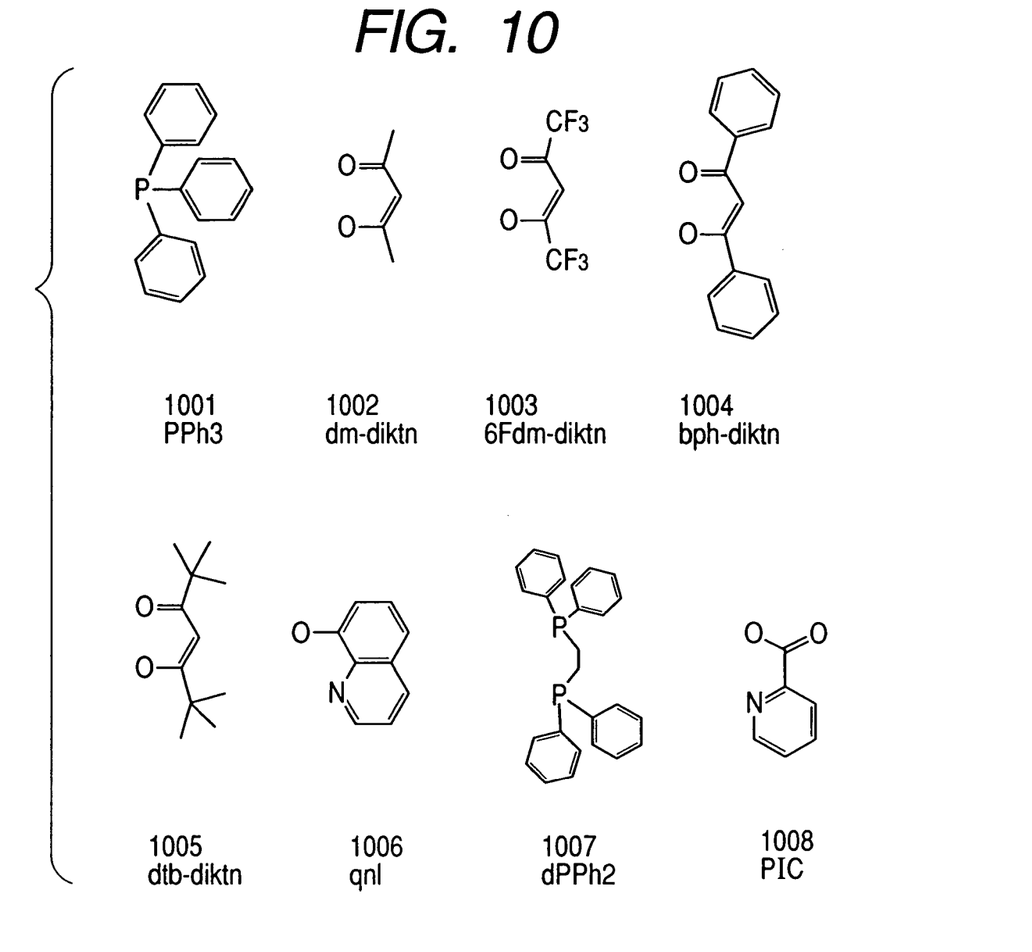
FIG. 10 is a view illustrating other monodentate or bidentate ligands that can be utilized for copper complexes of the present invention, in which PPh3 (1001) is a monodentate ligand and coordinates with copper (Cu) at the phosphorus (P), and the others are bidentate ligands and coordinate with copper (Cu) at the oxygen (O), nitrogen (N), and phosphorus (P)
Figure 11:
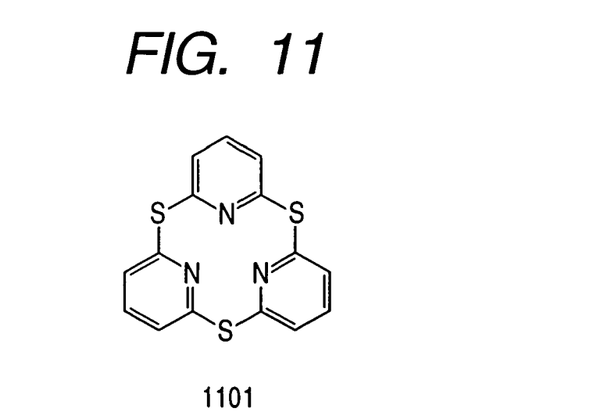
FIG. 11 is a view illustrating another ligand 1101 that can be utilized for copper complexes of the present invention, which is a tridentate ligand and coordinates with copper (Cu) at the three nitrogen atoms)

The copper coordination compounds that can be utilized for the present invention are not limited to those mentioned above. For example, although FIGS. 8 and 9 illustrate only the main skeletal structures of the ligands, the hydrogen atom(s) thereof may be substituted with alkyl group(s), aromatic ring group(s), halogen atom(s), or the like. Further, they may have a fused ring structure or have CH group(s) thereof substituted with nitrogen atom(s).

A key feature of the copper coordination compounds preferably used in the present invention is that the nitrogen atom of a heterocyclic ring imine structure coordinates with Cu of +1 charge. The excited state of the copper coordination compounds having such a structure belongs to the so-called Metal-to-Ligand Charge Transfer (MLCT) excited state, so that a strong light emission can be obtained. In order to attain this excited state, it is preferable that the ligand has a large electron acceptance. For instance, in case of a bidentate ligand, both the two atoms of the ligand for coordination with the metal are nitrogen atoms with the imine structure. For this purpose, there can be employed, for example, 2,9-phenanthroline, 2,2'-bipyridine, and derivatives thereof. Further, in case of a monodentate ligand, pyridine derivatives can be employed.

In the present invention, it is especially preferable to adopt such a ligand structure as to suppress a structural change between a ground state and an excited state. The coordination structure of a copper complex in which the copper ion as a metal center is in +1 charge state (hereinafter referred to as "Cu(1)") is a pseudo-tetrahedral structure of 4 coordinate, and it is preferable to maintain this structure also in an excited state in order to obtain a high light-emission luminance.

For example, in the case of Compound Example 1 shown in FIG. 12, each phenanthroline is substituted at positions 2 and 9 with two isobutyl groups. This exhibits an effect of maintain the pseudo-tetrahedral structure taken in a ground state also in an excited state to provide a high light-emission luminance. Although in an excited state the two phenanthrolines are liable to take a single planer configuration, the phenanthrolines can be substituted with bulky isobutyl groups to maintain the pseudo-tetrahedral structure. It is believed that Compound Examples 3-8 shown in FIG. 12 also exhibit high-luminance light emission characteristics on the basis of the same theory.

Further, the copper complexes used for the present invention, when compared with other commonly used light emitting materials, show not so higher light emission efficiencies in a solution but shows very strong light emission in a solid state of a film-shaped light emitting device. The possible reason for this phenomenon is as follows.

1. The coordination structure of Cu(1) in a ground state is the pseudo-tetrahedral structure of 4 coordinate. When the Cu(1) in the ground state are excited to be brought into an excited state, in order to form the MLCT excited state, the Cu becomes to have a charge near +2, so that taking a planer configuration becomes stable. This results in a great change in structure between the excited state and the ground state, so that thermal deactivation routes for energy increase to weaken the light emission. However, because this structural change is inhibited in a solid state, the suppression of the structural change would provide a strong light emission.

2. There is a possibility that in a solution, an additional coordination structure may be formed to form 5-coordinate structure, so that a strong light emission can not be obtained. Such 5-coordinate formation reaction is difficult to occur in a solid state because of the suppressed molecular motion, whereby a strong light emission can be obtained in a solid state.

Further, the Cu coordination compounds used for the present invention has a light emission lifetime of 0.1 μsec or more in a solid state. The longer the light emission lifetime, the fewer the thermal deactivation routes and the higher the light emission efficiency. Thus, the coordination compounds used for the present invention has a light emission lifetime of preferably 0.1 μsec or more, more preferably 0.5 μsec or more.

The hitherto used aluminoquinolinol derivatives, coumarin derivatives, quinacridone derivatives, and so on provide a strong light emission in a solution and the strong light emission characteristics are maintained also in a solid dispersion. The characteristics effectively function also in an organic EL device to provide a high light-emission efficiency of the device.

On the other hand, the Cu complexes used in the present invention have a unique property of providing a remarkably stronger light emission in a solid state than in a solution. The present inventors have found that this unique property is very useful for attaining a highly efficient, stable light emission of organic EL devices.

Further, the present invention can also be applied to polymer materials. For example, as shown in FIG. 13, a Cu coordination compound can be incorporated into a polymer chain to make the incorporated portion effectively function as a light emitting moiety.

The Cu coordination compounds in accordance with the present invention are useful as a light emitting material for organic EL devices. They have not only high light emission efficiencies but also properties suitable for film formation by vapor deposition or spin coating after dispersion into a polymer. Further, it becomes possible to stably produce EL devices without damages such as decomposition during device production steps. Moreover, it has been confirmed that EL devices produced using the Cu coordinating compounds pose no problem to light emission stability during current passing.

Further, as shown in examples as described below, durability tests by current passing have proved that the Cu coordination compounds in accordance with the present invention have an excellent performance in stability.

In application to a display, application to a system driven by use of a thin film transistor (TFT) drive circuit of active matrix type can be mentioned.

Moreover, the switching device used is not particularly limited and application is possible to single-crystal silicon substrates, MIM devices, amorphous silicon (a-Si) type devices, and so on.

The light emitting device of a high light emission efficiency of the present invention can be applied to those products which require energy saving or high luminance. Such application examples include a light source for displays, illumination apparatuses or printers, a backlight for liquid crystal display apparatuses, and so on. As an image display apparatus, a lightweight flat-panel display with energy saving performance and high visibility can be provided. As a light source for printers, the light emitting device of the present invention can be used as a substitution for a laser light source portion of laser beam printers currently used widely. An image can be formed by arranging the independently addressable devices of the present invention on an array and performing a desired exposure to a photosensitive drum. Using the device of the present invention makes it possible to greatly reduce the apparatus size. When it is utilized as a backlight of illumination apparatuses or liquid crystal displays, energy-saving effect can be expected.

As described above, Compounds Examples 1-10 of FIG. 12 were synthesized by referring to the documents. The molecular structures of the thus obtained compounds were identified by means of a mass spectrometer, NMR, or the like. As to the materials shown in Table 6 below of the compounds, light emission characteristics by photoexcitation was measured. The light emission spectrum was measured using Hitachi F4500 fluorescence spectrophotometer (excitation wavelength: 380-450 nm).

Further, the light emission lifetime was measured using model C4334 Streakscope manufactured by Hamamatsu Photonics Co. with a nitrogen laser light of wavelength 337.1 nm as an excitation light. All the measurements were carried out in a powder state. Moreover, the light emission spectrum was measured also for 5% by weight dispersion liquid of the compound in polymethyl methacrylate (PMMA) to obtain substantially the same spectrum as that for the compound powder.

TABLE 6

| Compound Example No. | Light Emission Spectrum Peak λmax (nm) | Light Emission Lifetime τ (msec) |
|---|---|---|
| 1 | 625 | 1 |
| 2 | 645 | 2.7 |
| 3 | 650 | 0.8 |
| 4 | 507 | 21.2 |
| 5 | 539 | 18.3 |
| 6 | 575 | 15 |
| 8 | 520 | 15 |
| 9 | 640 | |
| 10 | 591 | 1.7 |

As a result, each compound example provided a strong light emission in the solid state.

EXAMPLES

In the following, the present invention will be further described by examples, but the present invention is not limited to such examples.

Example 1

An organic EL device was produced using Compound Example 4 as a light emitting material.

A device of a constitution having a single organic layer was produced. After forming an ITO film in a thickness of 100 nm on a glass substrate, the film was patterned such that each opposing area of upper and lower electrodes becomes 3 mm². Then, the following solution was prepared and applied by spin coating to the thus prepared ITO substrate.

(Solution)

Chlorobenzene: 10 g;

Polyvinyl carbazole (Average molecular weight: 9600): 100 mg; and

Compound Example 4: 3.0 mg

By performing spin coating using this solution at 2000 rpm for 20 seconds in a nitrogen atmosphere, an organic film of 120 nm in thickness could be obtained. After the film formation, the substrate was put in a vacuum vapor deposition chamber and a cathode of the following constitution was formed.

(Cathode)

Metal electrode layer 1 (15 nm): Al—Li alloy (Li content: 1.8% by weight); and

Metal electrode layer 2 (100 nm): Al

Then, a DC voltage was applied to the device with the Al electrode being a cathode and the ITO electrode being an anode to evaluate the device characteristics.

Figure 14:
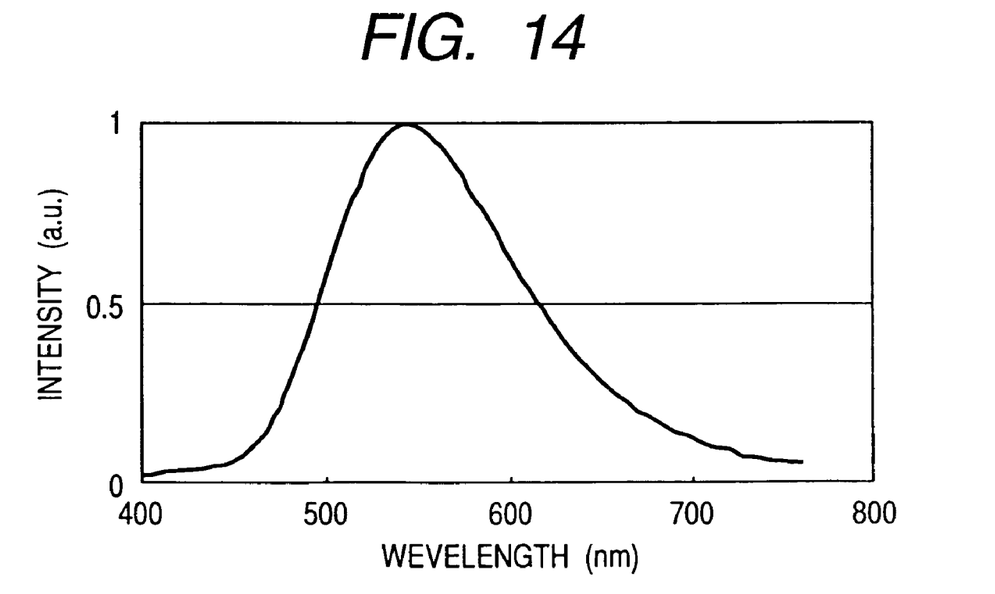
FIG. 14 is a graphical representation showing a light emission spectrum of the light emitting device of Example 1.

A result of measurement of the current-voltage characteristics showed that the device of this example prepared using Compound Example 4 had a good rectifying property. The light emission spectrum was measured with a spectrometer SR1 manufactured by TOPCON CORP. As is seen from the result shown in FIG. 14, the light emission spectrum peak is 545 nm, which is longer by about 40 nm than the PL (photoluminescence) spectrum peaks of the powder sample and the in-PMMA dispersed sample. The color of the emitted light was yellowish green by visual observation and stable light emission was maintained during continuous current passing for 200 hours. The light emission efficiency under application of a voltage of 10 V was calculated to be 0.5 lm/W.

Example 2

An organic EL device was produced following the same procedure as in Example 1, with the exception that Compound Example 1 was used as a light emitting material in place of Compound Example 4 used in Example 1. In this example, the light emission spectrum peak was 650 nm and a light emission of red color was observed. Stable light emission was maintained during continuous current passing for 200 hours.

Example 3

An organic EL device was produced following the same procedure as in Example 1, with the exception that Compound Example 8 was used as a light emitting material in place of Compound Example 4 used in Example 1. In this example, the light emission spectrum peak was 523 nm and a light emission of green color was observed. Stable light emission was maintained during continuous current passing for 200 hours.

Example 4

A light emitting material of a molecular structure having a Cu complex incorporated into a polymer was prepared.

First, a synthesis method will be described.

A Cu monomer metal complex compound for the present invention can be obtained via a synthesis pathway shown below.

Specifically, in a 100 ml 3-necked flask, 20 ml of acetonitrile and 0.54 g (5.45 mmole) of copper iodide were put in, 0.40 g (1.92 mmol) of 2,9-dimethyl-1,10-phenanthroline dissolved in 20 ml of hot ethanol was slowly added thereto in a stream of nitrogen, and the mixture was heated under reflux with stirring for 1 hour. Thereafter, 0.41 g (1.92 mmol) of 2-(acetacetyloxy)ethyl methacrylate dissolved in 10 ml of ethanol was slowly added thereto, and the mixture was heated under reflux for 24 hours. The reaction product was cooled with ice, and a precipitate was separated by filtration and washed with water. After the filtrate was removed under reduced pressure, purification was performed using a preparative HPLC manufactured by Nippon Bunsekikagaku K.K. to give the objective compound M1.

[Polymerization Reaction]

In a polymerization tube, 2 ml of N,N'-dimethyl formamide, 49 mg (0.1 mmol) of the compound M1, 174 mg (0.9 mmol) of VK (vinylcarbazole), and 1.64 mg (0.001 mmol) of AIBN (2,2'-azobis(isobutylonitrile)) were put in, and, after degassing and sealing, were heated under agitation for 20 hours at 60° C. After the reaction completed, the reaction mixture was re-precipitated three times from 100 ml of ether, and obtained powder was dried under heating at a reduced pressure to obtain the compound P1. The polymer compound had an average molecular weight of about 15,000. The molar ratio of the introduction rate of the compound M1 and VK was found to be about 1:29 by means of $^1$H-NMR.

A 1% chloroform solution of this polymer compound was prepared and subjected to flow casting on a glass sheet, followed by measurement of photoluminescence spectrum using Hitachi F4500 fluorescence spectrophotometer with an excitation wavelength of 350 nm. The light emission peak wavelength was 560 nm, and a strong light emission was confirmed. The light emission lifetime at that wavelength was 0.5 μsec.

Example 5

A device of a constitution having a single organic layer was produced using the polymer coordination compound prepared in Example 4. A 1.1 mm thick, 5 cm square glass substrate with a transparent electrode ITO film was provided, and the ITO film was patterned in a predetermined shape. A 2% chloroform solution of the compound P1 was prepared and applied thereon by spin coating under the conditions of 2000 rpm for 20 seconds. Thereafter, drying was effected at 80° C. for 2 hours to obtain a polymer film of 120 nm in thickness. As an opposing electrode, a film consisting of a 10 nm thick Al—Li alloy layer and a 100 nm thick Al layer was formed by vapor deposition using a mask of a predetermined aperture pattern to form a light emitting device. When a DC voltage of 20 V was applied to the electrodes, the device emitted a light at an emission wavelength 570 nm, and stable light emission was maintained during continuous current passing for 200 hours.

Example 6

The compound obtained in Example 4 was employed in the preparation of a single-bit organic EL device the organic layer of which was constituted of the three layers, namely a hole transport layer, a light emitting layer and an electron transport layer as shown in FIG. 1B, and the characteristics of the device were measured.

An alkali-free glass substrate was employed as a transparent substrate 15, and, on the substrate, was formed indium tin oxide (ITO) in a thickness of 100 nm by sputtering as a transparent electrode 14 and was patterned into an electrode size of a diameter of 2 mm.

BPhen

-continued

PEDOT       PSS

A hole transport layer 13 was formed thereon in a thickness of 30 nm by spin coating of a polymer film forming solution of a mixture of PEDOT and PSS represented by the foregoing chemical formulas. Then, a light emitting layer 12 was formed by two times of spin coating of a 1.0% chloroform solution of the polymer compound P1 of Example 4, followed by drying for 60 minutes in an oven of 60° C. to attain a film thickness of 70 nm. Then, an electron transport layer 16 was formed by resistance-heated evaporation of Bphen compound of the foregoing structure in vacuum of $10^{-4}$ Pa in a film thickness of 40 nm.

Then, potassium fluoride (KF) was provided in a thickness of 5 nm as an underlying layer for a metal electrode layer. Then, a metal electrode 11 was formed by evaporating an aluminum (Al) film of a thickness of 100 nm to form a cathode layer, whereby an organic EL device was prepared.

In order to investigate the characteristics of thus prepared organic EL device, the current-voltage characteristics were measured with a microammeter 4140B manufactured by Hewlett-Packard Co., and the luminance of light emission was measured by Model BM7 manufactured by TOPCON CORP. As a result, the device of this example prepared using Compound Example 4 showed a good rectifying property.

Further, a light emission from this EL device was confirmed under application of a voltage of 15 V. The light emission wavelength peak was 565 nm; substantially the same light emission wavelength as that of Example 5 was confirmed; and there was confirmed a light emission derived from the Cu coordination moiety of the polymer compound.

INDUSTRIAL APPLICABILITY

The present invention has been described in detail above with reference to the preferred embodiments and the examples. According to the present invention, by employing a copper complex as a light emitting material, it is possible to provide a light emitting device of a high light-emission luminance. Further, because the copper complexes are generally inexpensive, the light emitting device of the present invention can usefully be applied to display apparatuses and so on.

The invention claimed is:
1. A light emitting device comprising a pair of electrodes provided on a substrate and an organic substance layer provided between the electrodes, wherein the organic sub- stance layer comprises a metal coordination compound represented by one of the following formulae:

2. The light emitting device according to claim 1, wherein the metal coordination compound has a light emission lifetime of 0.1 μsec or more.

3. The light emitting device according to claim 1, wherein the metal coordination compound has a light emission lifetime of 0.5 μsec or more.

4. A display apparatus comprising the light emitting device as set forth in claim 1 and an electrical signal application circuit for applying an electrical signal to drive the light emitting device.

* * * * *